(12) United States Patent
Ohmi et al.

(10) Patent No.: US 7,521,324 B2
(45) Date of Patent: Apr. 21, 2009

(54) SEMICONDUCTOR DEVICE AND METHOD FOR MANUFACTURING THE SAME

(75) Inventors: Tadahiro Ohmi, 1-17-301, Komegafukuro, 2-chome Aoba-ku, Sendai-shi, Miyagi (JP) 980-0813; Akinobu Teramoto, Sendai (JP); Hidetoshi Wakamatsu, Sendai (JP); Yasuo Kobayashi, Nirasaki (JP)

(73) Assignees: Tadahiro Ohmi, Sendai-shi (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/551,843

(22) PCT Filed: Mar. 31, 2004

(86) PCT No.: PCT/JP2004/004700
§ 371 (c)(1),
(2), (4) Date: Sep. 27, 2006

(87) PCT Pub. No.: WO2004/090991
PCT Pub. Date: Oct. 21, 2004

(65) Prior Publication Data
US 2007/0052042 A1     Mar. 8, 2007

(30) Foreign Application Priority Data
Apr. 3, 2003   (JP)   ............... 2003-100170

(51) Int. Cl.
*H01L 21/336*   (2006.01)
(52) U.S. Cl. ..................... 438/287; 438/791
(58) Field of Classification Search ........ 438/258, 438/287, 775, 776, 777

See application file for complete search history.

(56) References Cited

U.S. PATENT DOCUMENTS 4,907,053 A * 3/1990 Ohmi ................... 257/315

(Continued)

FOREIGN PATENT DOCUMENTS

JP     2000-004018 A     1/2000

(Continued)

OTHER PUBLICATIONS

Huppertz, Hubert Ba2Nd7Si11N23—A Nitridosilicate with a Zeolite-Analogous Si—N Structure, Angew. Chem. Int. Ed. Engl. 1997, vol. 36, No. 23, p. 2651-2.*

(Continued)

*Primary Examiner*—N Drew Richards
*Assistant Examiner*—Grant S Withers
(74) *Attorney, Agent, or Firm*—Crowell & Moring LLP

(57) ABSTRACT

In order to provide a semiconductor device having good quality by keeping the relative permittivity of a High-K insulation film in a high state, or to provide a method for manufacturing a semiconductor device in which the relative permittivity of the High-K insulation film can be kept in a high state, a semiconductor device is disclosed that includes a silicon substrate, a gate electrode layer, and a gate insulation film between the silicon substrate and the gate electrode layer. The gate insulation film is a high relative permittivity (high-k) film being formed by performing a nitriding treatment on a mixture of a metal and silicon. The High-K film itself becomes a nitride so as to prevent $SiO_2$ from being formed.

11 Claims, 5 Drawing Sheets

U.S. PATENT DOCUMENTS

| | | | |
|---|---|---|---|
| 5,876,788 A * | 3/1999 | Bronner et al. | 427/81 |
| 6,277,681 B1 | 8/2001 | Wallace et al. | |
| 6,291,866 B1 * | 9/2001 | Wallace et al. | 257/410 |
| 2002/0172768 A1 | 11/2002 | Endo et al. | |
| 2003/0003667 A1 | 1/2003 | Morisaki et al. | |
| 2004/0031985 A1 * | 2/2004 | Inoue et al. | 257/315 |
| 2006/0194451 A1 * | 8/2006 | Lee et al. | 438/786 |

FOREIGN PATENT DOCUMENTS

| | | |
|---|---|---|
| JP | 2000-294550 A | 10/2000 |
| JP | 2001 332547 A | 11/2001 |
| JP | 2002-343790 A | 11/2002 |
| JP | 2003-008004 A | 1/2003 |
| JP | 2003-17687 A | 1/2003 |
| JP | 2003-100170 A | 4/2003 |
| WO | WO01/66832 * | 3/2001 |
| WO | WO 03/003471 A1 | 1/2003 |
| WO | WO2005/015621 * | 2/2005 |

OTHER PUBLICATIONS

Koyama, Masato "Effects of Nitrogen in HfSiON Gate Dielectric on the Electrical and Thermal Characteristics" 2002 IEEE IEDM pp. 849-852.*

International Preliminary Examination Report for PCT/EP 03/50352.*

Gordon, Roy "Vapor Deposition of Metal Oxides and Silicates: Possible Gate Insulators for Future Microelectronics" Chem. Mater. 2001 13 pp 2463-2464.*

Hamelmann, F. "W/Si multilayers deposited by hot-filament MOCVD" Thin Solid Films 338 (1999) pp. 70-74.*

Visokay, M. R. "Application of HfSiON as a gate dielectric material" App. Phys. Letters vol. 80 No. 17 Apr. 29, 2002 pp. 3183-3185.*

* cited by examiner

SEMICONDUCTOR DEVICE AND METHOD FOR MANUFACTURING THE SAME

TECHNICAL FIELD

The present invention generally relates to an improvement of a semiconductor device in which a high relative permittivity (high-k) film is used as a gate insulation film.

BACKGROUND ART

In the conventional technology, polysilicon (Poly-Si) is mainly used as an electrode material which is formed on a silicon substrate. As a gate insulation film provided between the silicon substrate and the polysilicon electrode material, a silicon oxide ($SiO_2$), a silicon oxynitride (SiON), and a silicon nitride ($Si_3N_4$) are used. As a related matter, in order to increase the capacity (proportional to $\in/d$, where e is relative permittivity, and d is film thickness) of the gate insulation film, the thickness of the gate insulation film ($SiO_2$ ($\in=3.9$)) is conventionally reduced.

According to Japanese Laid-Open Patent Application No. 2000-294550, a method is disclosed wherein a gate insulation film having an equivalent oxide thickness of 1 nm or less is provided by performing an oxidation, nitriding, and oxynitriding directly on the surface of the wafer W by plasma processing.

There is a limitation to reducing the thickness of the gate insulation film; however, a method is presently suggested wherein the physical thickness of the layer can be increased to a certain extent by using a material having a high relative permittivity (High-K, where K is an equivalent to $\in$).

DISCLOSURE OF THE INVENTION

A conventional High-K film is made from oxide; however, oxidizing species are indispensable when forming an oxide film. Further, it is necessary to perform a high heating treatment in an atmosphere of the oxidizing species or inert gas species so as to stabilize the crystallinity of the oxide. As a result, $SiO_2$ (or a metal mixture including Si, O, and a High-K material) is formed on the Si surface or on the surface of the oxide High-K film. Accordingly, layers having a low relative permittivity are formed serially. Therefore, the original object of increasing the capacity cannot be achieved.

Accordingly, a method is suggested for providing a silicon nitride film ($\in$ is about 7) between the Si surface and High-K material so as to prevent the $SiO_2$ film from being formed. However, the silicon nitride film is oxidized while the High-K film is formed. Thus, it is difficult to form only a film having a high relative permittivity.

The present invention was made in consideration of the above described problems. It is a general object of the present invention to provide a semiconductor device having good quality by keeping the relative permittivity of a High-K insulation film in a high state. Another object of the present invention is to provide a method for manufacturing a semiconductor device in which the relative permittivity of the High-K insulation film can be kept in a high state.

In order to achieve the above described objects, a semiconductor device is provided including a silicon substrate, a gate electrode layer, and a gate insulation film between the silicon substrate and the gate electrode layer. The gate insulation film is a high relative permittivity (high-k) film being formed by performing a nitriding treatment on mixture of a metal and silicon. In other words, the High-K film itself is a nitride so as to prevent $SiO_2$ from being formed.

As for the above described gate insulation film, it is preferable to form the film according to a plasma CVD technology. Further, in a case where a silicon nitride film is provided as a barrier layer between the silicon substrate and the gate insulation film, it is less likely that the thickness of the film increases while the High-K material is being formed. Thus, a decrease of the capacity can be controlled. This is based on the fact that the thickness of the silicon nitride film is less likely to increase than the thickness of the oxide film. It should be noted that the above described silicon nitride layer can be formed according to a direct nitriding by plasma processing.

Moreover, a silicon nitride film is provided on the gate insulation film so as to control a reaction with the gate electrode.

Furthermore, a more stable insulation film can be obtained by laminating the silicon nitride films and the gate insulation films alternately on the silicon substrate.

Further, interfacial quality can be improved and a good FET quality can be obtained by forming a buffer layer between the silicon substrate and the gate insulation film.

In addition, the relative permittivity of the buffer layer can be increased to substantially 9 by forming an Alumina ($Al_2O_3$) monocrystal film between the silicon substrate and the gate insulation film. Accordingly, the capacity can be further increased. It should be noted that the above described alumina monocrystal film can be formed according to the plasma CVD technology.

As for the above described gate insulation film, one of the following compositions can be adopted:

| | |
|---|---|
| $M_3Si_6N_{11}$ | (M = La, Ce, Pr, Nd, Sm); |
| $M_2Si_5N_8$ | (M = Ca, Sr, Ba, Eu); |
| $MYbSi_4N_7$ | (M = Sr, Ba, Eu); |
| $BaSi_4N_7$; | |
| $Ba_2Nd_7Si_{11}N_{23}$ | |

BEST MODE FOR CARRYING OUT THE INVENTION

Figure 1:
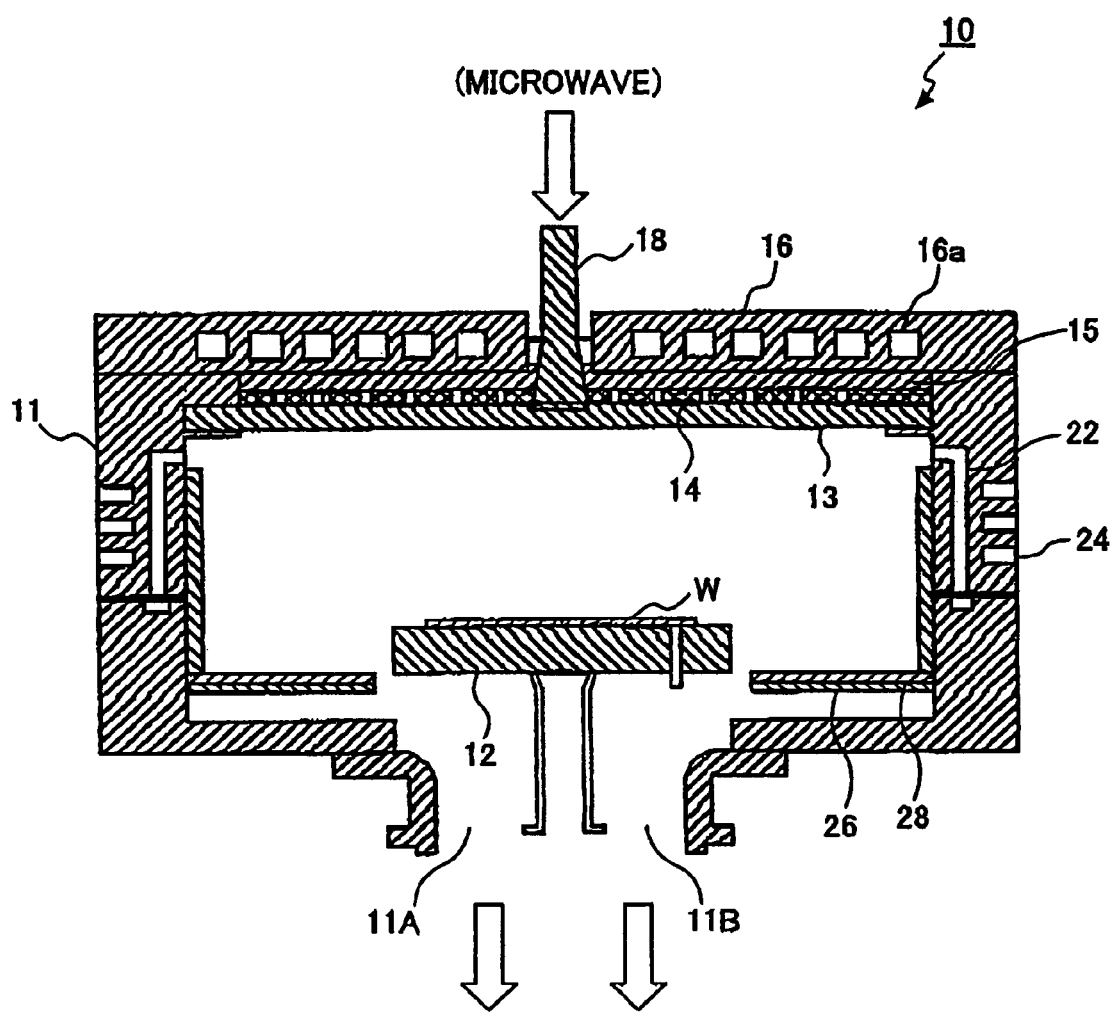
FIG. 1 is a schematic diagram (cross section) showing an example of the configuration of the plasma treatment apparatus according to the present invention.

FIG. 1 is a schematic diagram showing an example of the configuration of a plasma treatment apparatus 10 according to the present invention. The plasma treatment apparatus 10 includes a treatment container 11 in which a substrate holding board 12 retaining a silicon wafer W as a substrate to be treated is embedded. Gas in the treatment container 11 is exhausted from exhaust ports 11A and 11B via an exhaust pump of which a drawing is omitted. It should be noted that the substrate holding board 12 has a function of heating the silicon wafer W. In the periphery of the substrate holding board 12, a gas baffle plate (partition) 26 which includes aluminum is provided. On the upper side of the gas baffle plate 26, a quartz cover 28 or a SiC cover 28 is provided.

On the upper side of the treatment container 11, an open part corresponding to the silicon wafer W on the substrate holding board 12 is provided. The above open part is closed by a dielectric board 13 which includes quartz, $Al_2O_3$, AlN, and $Si_3N_4$. On the upper side of the dielectric board 13, (outside of the treatment container 11) a plane antenna 14 is disposed. On the plane antenna 14, plural slots are provided so that an electromagnetic wave which is supplied from a wave guide 18 can permeate via the slots. On the further upper side (outside) of the plane antenna 14, a wavelength shortening board 15 and the wave guide 18 are provided. On the outside of the treatment container 11, a cooling plate 16 is disposed so as to cover the upper side of the wavelength shortening board 15. In the cooling plate 16, a coolant path 16a in which a coolant flows is provided.

On the side wall of the inside of the treatment container 11, a gas feed opening 22 is provided for introducing a gas when performing a plasma treatment. A separate gas feed opening 22 can be provided for each gas to be introduced. In this case, a mass flow controller of which the drawing is omitted is provided as means for flow control on each gas feed opening 22. As a related matter, a gas feed opening 22 can be a nozzle to which gases to be introduced being mixed in advance are supplied. In this case, the flow of the gas to be introduced is controlled by a flow regulating valve in the step of mixing the gas.

Moreover, in the inside of the wall of the treatment container 11, a coolant flow path 24 is provided so as to surround the treatment container 11.

The plasma treatment apparatus 10 used in the present invention embeds an electromagnetic wave generator generating a few GHz electromagnetic wave for exciting plasma, of which a drawing is omitted. The microwave generated by the electromagnetic wave generator propagates through the wave guide 18 and is introduced into the treatment container 11.

Figure 2:
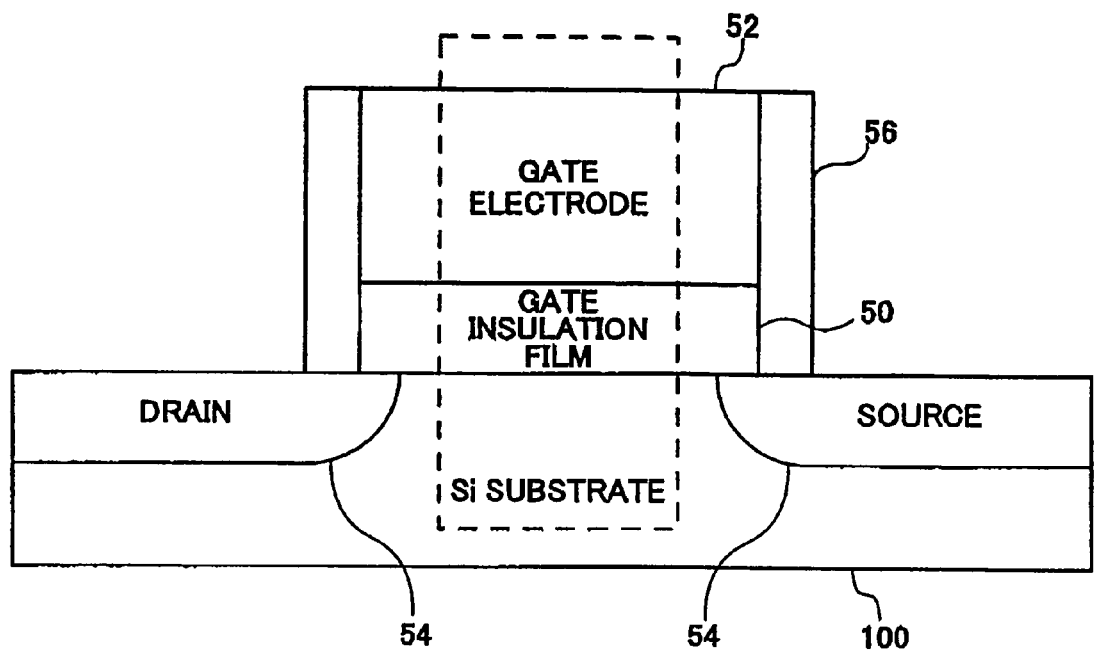
FIG. 2 is a cross section showing the configuration of the semiconductor device according to the present invention.

FIG. 2 is a cross section of a configuration of a semiconductor device (MISFET) according to the present invention. The present invention relates to the composition and the configuration of a gate insulation film 50. A description of each embodiment is given below. FIG. 2 shows a silicon substrate 100, the gate insulation film 50, a gate electrode 52, a source/drain layer (diffusion layer) 54, and a sidewall 56.

With reference to FIGS. 3 through 8, a description is given of the configuration of the gate insulation film according to the first through fifth embodiments of the present invention. It should be noted that each figure substantially corresponds to the dash line part of FIG. 2.

Figure 3:
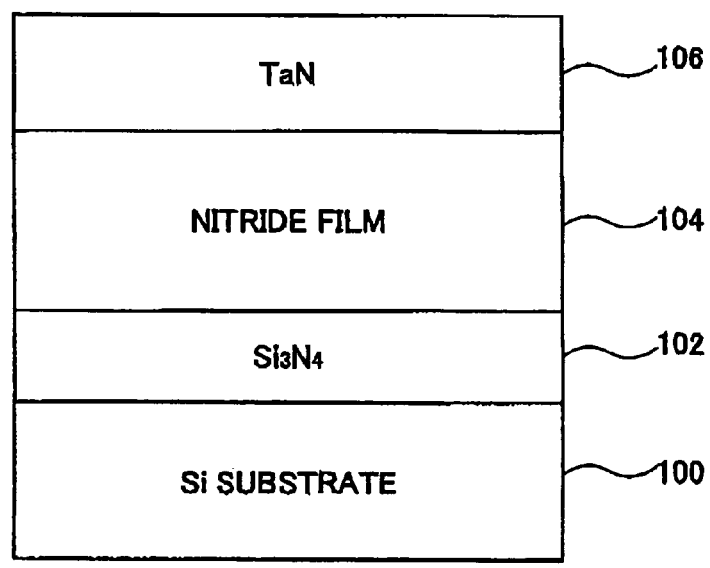
FIG. 3 is a schematic diagram showing the configuration of the substantial part of the semiconductor device according to the first embodiment of the present invention.

FIG. 3 is a schematic diagram showing the configuration of the substantial part of the semiconductor device according to the first embodiment of the present invention. In the semiconductor device of the present embodiment, a nitride High-K film 104 is formed as a gate insulation film (50) on the silicon substrate 100. A silicon nitride film ($Si_3N_4$ layer) 102 is formed between the silicon substrate 100 and the High-K film 104. Further, a TaN layer 106 is formed as a gate electrode (52) on the High-K film 104 by spattering. The High-K film 104 is formed by using the plasma treatment device 10 according to a plasma CVD technology. The silicon nitride film 102 is formed in the same way by using the plasma treatment apparatus 10 according to a direct radical nitriding treatment. The silicon nitride film 102 performs a function of lowering the interface state.

As the High-K film 104, for example, one of the following compositions can be adopted:

| | |
|---|---|
| $M_3Si_6N_{11}$ | (M = La, Ce, Pr, Nd, Sm); |
| $M_2Si_5N_8$ | (M = Ca, Sr, Ba, Eu); |
| $MYbSi_4N_7$ | (M = Sr, Ba, Eu); |
| $BaSi_4N_7$; | |
| $Ba_2Nd_7Si_{11}N_{23}$ | |

When forming a configuration according to the first embodiment using the plasma treatment apparatus 10 shown in FIG. 1, first, the silicon substrate 100 on which a plasma treatment is to be performed is introduced into the treatment container 11 and set on the substrate holding board 12. Then, the gas in the treatment container 11 is exhausted via the exhaust ports 11A and 11B so that the inside of the treatment container 11 can be set at a predetermined treatment pressure. Next, a nitrogen gas and an inert gas are introduced into the treatment container 11 from the gas feed opening 22.

The microwave having a few GHz generated by the electromagnetic wave generator is supplied to the treatment container 11 via the wave guide 18. The microwave is introduced into the treatment container 11 via the plane antenna 14 and the dielectric board 13. The microwave excites the plasma, and thus a nitride radical is generated. The temperature of the wafer is less than 500° C. when performing a plasma treatment thereon by using the plasma as above generated. The high density plasma which is generated by the microwave in the treatment container 11 forms a nitride film $Si_3N_4$ on the surface of the silicon substrate 100.

The silicon substrate 100 on which the $Si_3N_4$ film 102 is formed is taken out of the treatment container 11. After the silicon substrate 100 is taken out, when forming a High-K film 104, the silicon substrate 100 is set in the treatment container 11 again, and the nitride film 104 is formed according to the well-known CVD technology.

Figure 4:
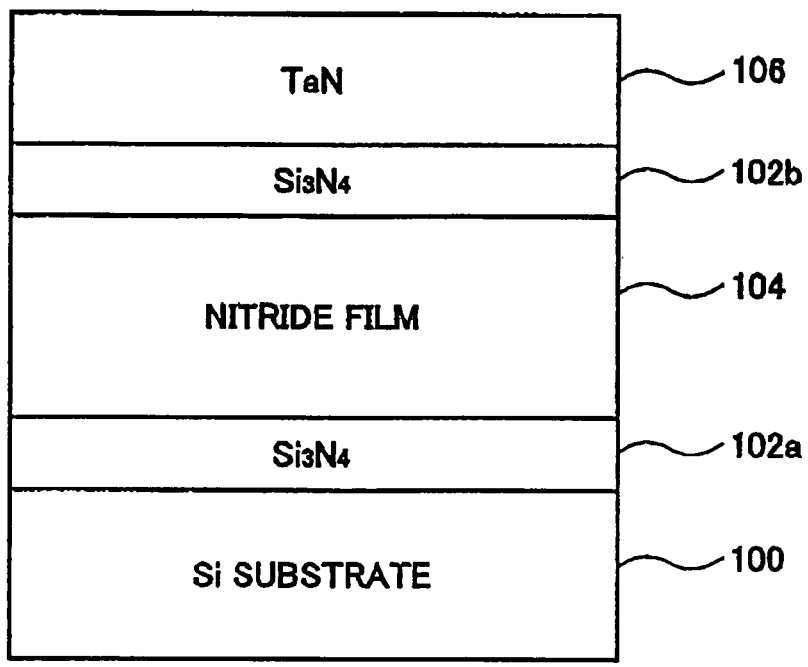
FIG. 4 is a schematic diagram showing the configuration of the substantial part of the semiconductor device according to the second embodiment of the present invention.

FIG. 4 is a schematic diagram showing the configuration of the substantial part of the semiconductor device according to the second embodiment of the present invention. In FIG. 4, the same or the corresponding components of FIG. 3 are allocated the same reference numbers, and overlapping descriptions are omitted. In the configuration according to the present embodiment, in the same way as the above described first embodiment, $Si_3N_4$ layer 102a is formed between the High-K film 104 and the silicon substrate 100, and $Si_3N_4$ layer 102b is formed between the High-K film 104 and the TaN layer 106. Accordingly, reactivity with the gate electrode (TaN layer 106) is controlled and a stable layer can be formed.

Figure 5:
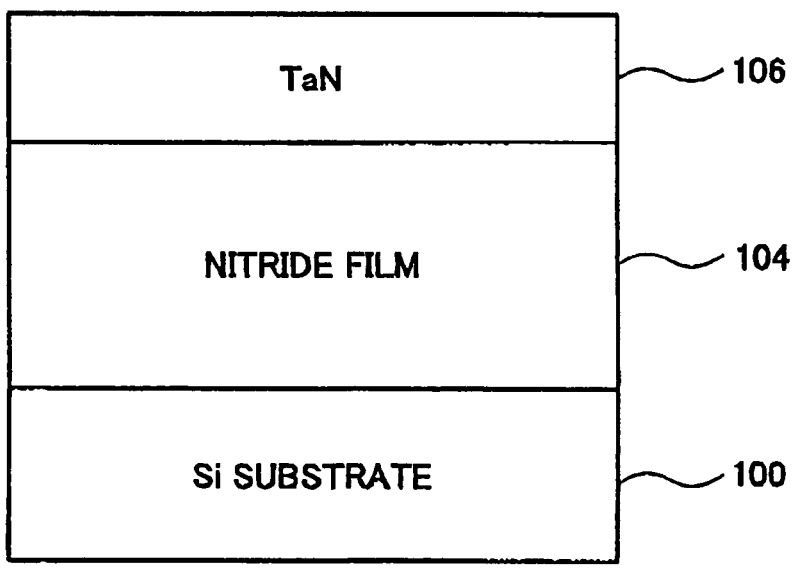
FIG. 5 is a schematic diagram showing the configuration of the substantial part of the semiconductor device according to the third embodiment of the present invention.

FIG. 5 is a schematic diagram showing the configuration of the substantial part of the semiconductor device according to the third embodiment of the present invention. In FIG. 5, the same or the corresponding components of FIG. 3 and FIG. 4 are allocated the same reference numbers, and overlapping descriptions are omitted. In the configuration of the present embodiment, the High-K film 104 is formed between the silicon substrate 100 and the gate electrode layer (TaN layer); however, another layer such as a $Si_3N_4$ layer is not formed between the silicon substrate 100 and the High-K film 104 or between the High-K film 104 and the TaN layer 106.

Figure 6:
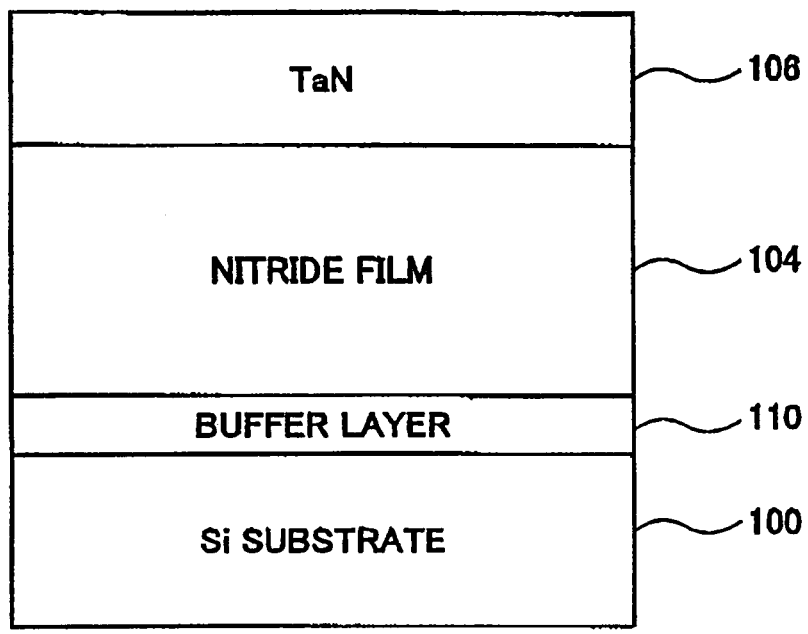
FIG. 6 is a schematic diagram showing the configuration of the substantial part of the semiconductor device according to the fourth embodiment of the present invention.

FIG. 6 is a schematic diagram showing the configuration of the substantial part of the semiconductor device according to the fourth embodiment of the present invention. In FIG. 6, the same or the corresponding components of FIG. 3 through FIG. 5 are allocated the same reference numbers, and overlapping descriptions are omitted. In the configuration of the present embodiment, a buffer layer 110 is formed between the silicon substrate 100 and the High-K film 104. It should be noted, however, that another layer such as a $Si_3N_4$ layer is not provided between the High-K film 104 and the TaN layer 106.

The buffer layer 110 is formed by changing the composition of the gas which is supplied to the treatment container 11 in the same process of forming the High-K film 104. The buffer layer 110 has the benefit of a relative permittivity higher than that of the $Si_3N_4$ layer, and an interface state which can be lowered.

Figure 7:
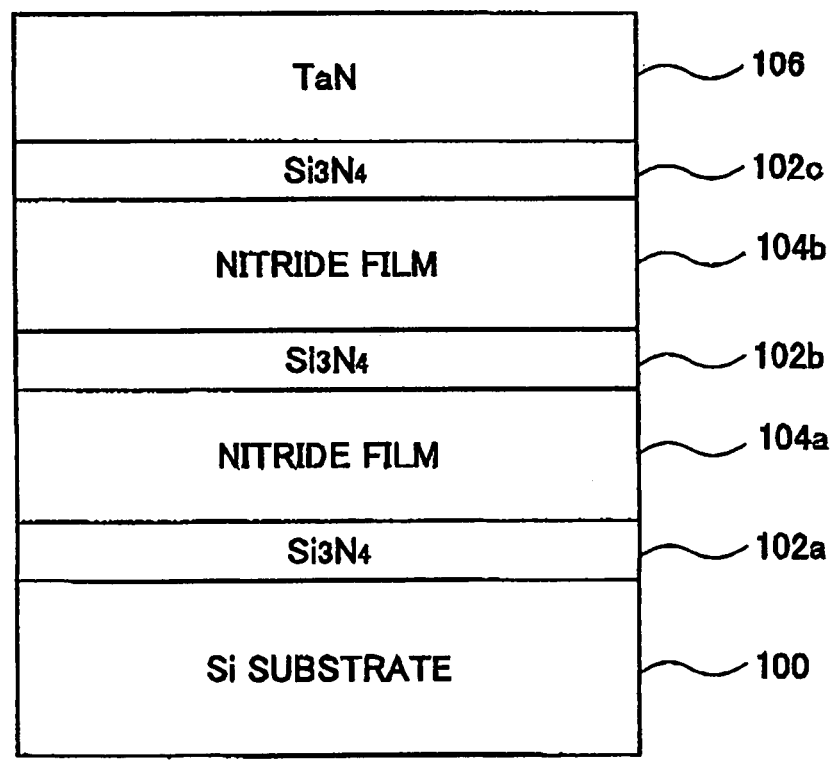
FIG. 7 is a schematic diagram showing the configuration of the substantial part of the semiconductor device according to the fifth embodiment of the present invention.

FIG. 7 is a schematic diagram showing the configuration of the substantial part of the semiconductor device according to the fifth embodiment of the present invention. In FIG. 7, the same or the corresponding components of FIG. 3 through FIG. 6 are allocated the same reference numbers, and overlapping descriptions are omitted. In the configuration of the present embodiment, three $Si_3N_4$ layers 102a, 102b, and 102c and two High-K films 104a and 104b are alternately laminated on the silicon substrate 100. Accordingly, a more stable insulation film can be obtained.

Figure 8:
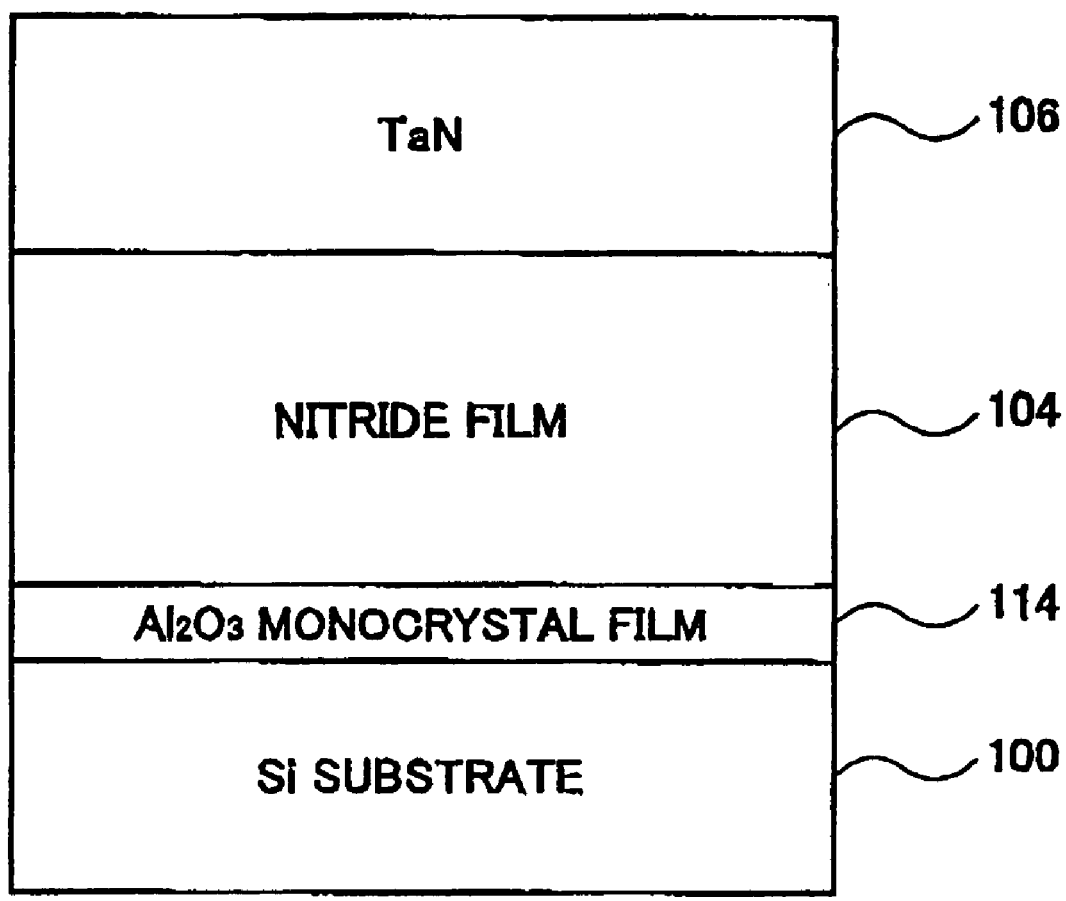
FIG. 8 is a schematic diagram showing the configuration of the substantial part of the semiconductor device according to the sixth embodiment of the present invention.

FIG. 8 is a schematic diagram showing the configuration of the substantial part of the semiconductor device according to the sixth embodiment of the present invention. In FIG. 8, the same or the corresponding components of FIG. 3 through FIG. 6 are allocated the same reference numbers, and overlapping descriptions are omitted. In the configuration of the present embodiment, an alumina ($Al_2O_3$) monocrystal film 114 having a relative permittivity higher than that of $Si_3N_4$ is formed between the silicon substrate 100 and the High-K film 104. The alumina ($Al_2O_3$) monocrystal film 114 can be formed by using the apparatus shown in FIG. 1 according to the plasma CVD technology.

Further, the best mode for carrying out the invention and the embodiments are described based on some examples. The present invention is not limited to these embodiments, but variations and modifications may be made without departing from the scope of the present invention.

The present application is based on Japanese Priority Application No. 2003-100170 filed on Apr. 3, 2003, with the Japanese Patent Office, the entire contents of which are hereby incorporated by reference.

The invention claimed is:

1. A method for manufacturing a semiconductor device comprising the steps of:
   forming a precursor film consisting essentially of a mixture of at least one metal and silicon,
   forming a gate insulation film by performing a nitriding treatment on the precursor film, and
   forming a gate electrode layer on the gate insulation film, wherein the gate insulation film is a high relative permittivity (high-k) film;
   wherein the gate insulation film is formed according to a plasma CVD technology.

2. The method for manufacturing the semiconductor device as claimed in claim 1, further comprising the step of forming a silicon nitride film as a barrier layer between the silicon substrate and the gate insulation film.

3. The method for manufacturing the semiconductor device as claimed in claim 2, wherein the silicon nitride film is formed according to a direct nitriding by plasma.

4. The method for manufacturing the semiconductor device as claimed in claim 1, wherein a silicon nitride film is disposed on the gate insulation film.

5. The method for manufacturing the semiconductor device as claimed in claim 4, wherein the silicon nitride film and the gate insulation film are alternately laminated on the silicon substrate.

6. The method for manufacturing the semiconductor device as claimed in claim 1, further comprising the step of forming a buffer layer between the silicon substrate and the gate insulation film.

7. The method for manufacturing the semiconductor device as claimed in claim 1, further comprising the step of forming an alumina ($Al_2O_3$) monocrystal film between the silicon substrate and the gate insulation film.

8. The method for manufacturing the semiconductor device as claimed in claim 7, wherein the alumina monocrystal film is formed according to a plasma CVD technology.

9. The method for manufacturing the semiconductor device as claimed in claim 1, wherein the gate insulation film has one of compositions selected from a following list:

| | |
|---|---|
| $M_3Si_6N_{11}$ | (M = La, Ce, Pr, Nd, Sm); |
| $M_2Si_5N_8$ | (M = Ca, Sr, Ba, Eu); |
| $MYbSi_4M_7$ | (M = Sr, Ba, Eu); |
| $BaSi_4N_7$; | |
| $Ba_2Nd_7Si_{11}N_{23}$. | |

10. The method for manufacturing the semiconductor device as claimed in claim 2, wherein a silicon nitride film is disposed on the gate insulation film.

11. A method for manufacturing a semiconductor device comprising the steps of:
   forming a precursor film consisting essentially of a mixture of at least one metal and silicon,
   forming a gate insulation film by performing a nitriding treatment on the precursor film, and
   forming a gate electrode layer directly on the gate insulation film, wherein the gate insulation film is formed directly on a silicon substrate, and the gate insulation film is a high relative permittivity (high-k) film;
   wherein the gate insulation film is formed according to a plasma CVD technology.

* * * * *